United States Patent [19]

Bereznak

[11] Patent Number: 4,703,495
[45] Date of Patent: Oct. 27, 1987

[54] HIGH SPEED FREQUENCY DIVIDE-BY-5 CIRCUIT

[75] Inventor: Bradley J. Bereznak, Sunnyvale, Calif.

[73] Assignee: Advanced Micro Device, Inc., Sunnyvale, Calif.

[21] Appl. No.: 866,828

[22] Filed: May 23, 1986

[51] Int. Cl.[4] .......................................... H03K 23/70
[52] U.S. Cl. ..................................... 377/108; 377/34; 377/116; 377/33; 377/47
[58] Field of Search ...................... 377/33, 34, 47, 48, 377/108, 111, 116, 106, 73, 74

[56] References Cited

U.S. PATENT DOCUMENTS 3,105,195  9/1963  Tarczy-Hornoch ................ 377/116
3,241,033  3/1966  Peaslee et al. .................... 377/116
3,530,284  9/1970  Wood ................................. 377/33
3,902,125  8/1975  Oliva .................................. 377/108
3,962,701  6/1976  Heimbigner ....................... 377/33
4,366,394  12/1982  Clendening et al. .............. 377/47
4,390,960  6/1983  Vamashita et al. ............... 377/73
4,606,059  8/1986  Oida .................................. 377/108

Primary Examiner—John S. Heyman
Attorney, Agent, or Firm—J. Vincent Tortolano; Patrick T. King

[57] ABSTRACT

An improved, high-speed frequency divider circuit (32) is presented. The frequency divider circuit (32) is comprised of three D-type flip-flops (34, 36 38). The three flip-flops (34, 36, 38) are clocked synchronously for higher speed of operation. The design of the frequency divider circuit (32) embodies a sagacious state assignment to minimize the number of bits that change state on any given state transition, thus reducing the possibility of faulty circuit operation.

6 Claims, 4 Drawing Figures

HIGH SPEED FREQUENCY DIVIDE-BY-5 CIRCUIT

FIELD OF THE INVENTION

This invention relates to frequency divider circuits and, more particularly, to an improved high-speed frequency divide-by-5 circuit.

BACKGROUND OF THE INVENTION

In various areas of electronics there is a need for circuits that will operate to divide frequency, typically in ultrahigh frequency applications. For example, a phase-locked loop system could require a frequency divider circuit for high frequency application.

As is well known in the prior art, a phase-locked loop consists essentially of a phase detector which compares the frequency of a voltage-controlled oscillator (VCO) with that of an incoming carrier signal or reference-frequency generator. The output of the phase detector is fed back to the VCO to keep it exactly in phase with the reference frequency.

In integrated circuits, the reference frequency for a phase-locked loop is typically provided by a crystal oscillator. However, it is expensive and difficult to manufacture a crystal oscillator that operates above 25 megahertz (MHz). Therefore, in a phase-locked loop which operates at 100–150 MHz, for example, a frequency-divider circuit is necessary to step down the frequency from the VCO before it is transmitted to the phase detector for comparison to the reference frequency from the crystal oscillator.

A divide-by-N frequency divider circuit (also called a counter circuit) will divide by a specific number of counts; that is, for N-clock pulses put into the circuit, only one output pulse is generated.

Conventional frequency-divider circuits for binary signals usually consist of master slave, D-type flip-flops. Such a flip-flop has a single data input (D input), either one or a pair of complementary data outputs (Q or $\bar{Q}$, or both), and a clock input (CLK). In operation, data in the form of a logic level present at the data input (D input) is transferred to the data output (Q output) when the clock input CLK makes a specified clock pulse edge or transition (i.e., transition from logic "low" or "0" level to logic "high" or "1" level). If provided, complementary data output is available at the $\bar{Q}$ output. When the clock input CLK level changes from the high state to the low state, the logic state present at the D input prior to the clock transition is retained or latched at the data output or outputs, regardless of subsequent changes in the data input, until such time as the clock input CLK makes a low-to-high transition again.

High-frequency circuit design requires that the number of parasitic capacitances and resistances be kept at a minimum. Parasitics associated with any given circuit node increase the delay of circuit operation related to that node. Hence, it is desirable to keep the number of interconnections to a minimum in a circuit designed to operate at high frequencies.

The general approach to minimizing interconnections is to reduce the complexity of the circuit. A small number of interconnections in general means a small number of components, particularly of components with three or more terminals (e.g., transistors). In a frequency divider circuit this translates to reducing the gate count through the signal path.

Another method of increasing the speed of a frequency-divider circuit is to operate all its flip-flops synchronously; that is, all driven by the same clock waveform. A synchronous divider circuit is one in which all flip-flops of the circuit change state simultaneously in response to a common clock. Since all flip-flops change simultaneously, the output (or count or state) can be decoded quickly because there is no count propagation to wait for.

A further objective in designing a high-speed frequency divider circuit is to reduce total propagation delay to a minimum. For this type of circuit, propagation delay is the time required for the network to stabilize in a new state, as measured from the low to high edge transition of the clock input (CLK) signal. Propagation delay can be reduced by judicious assignment of the states of the counter flip-flops.

SUMMARY OF THE INVENTION

It is, therefore, an object of this invention to provide a frequency divider circuit capable of operating at frequencies of 125 MHz and above.

It is another object of this invention to provide a frequency divider circuit which has a minimum number of interconnections to keep parasitic capacitances and resistances to a minimum.

It is still another object of this invention to provide a frequency divider circuit which operates synchronously.

It is a further object of this invention to provide a frequency divider circuit having reduced propagation delay.

In accordance with the present invention, a high-speed frequency divide-by-5 circuit is provided. Specifically, the circuit of the present invention includes three D-type flip-flops wherein a first output of the first flip-flop is coupled to a data input of the second flip-flop, a first output of the second flip-flop is coupled to a data input of the third flip-flop, and a first output of the third flip-flop is coupled back to the data input of the second flip-flop. Each flip-flop has a clock input coupled to a means for simultaneously providing a clock pulse to each flip-flop. A second output of the first flip-flop is the output for the frequency divide-by-5 circuit.

Other objects, features and advantages of the present invention will become apparent upon consideration of the following detailed description and the accompanying drawings, in which like reference designations represent like features throughout the figures.

DETAILED DESCRIPTION OF THE INVENTION

Reference is now made, in detail, to a specific embodiment of the present invention which illustrates the best mode presently contemplated by the inventor for practicing the invention, the preferred embodiment of which is set forth in the accompanying drawings. The drawings referred to in this description are understood to be not drawn to scale and to illustrate only one portion of an integrated circuit fabricated in accordance with the present invention.

Figure 1:
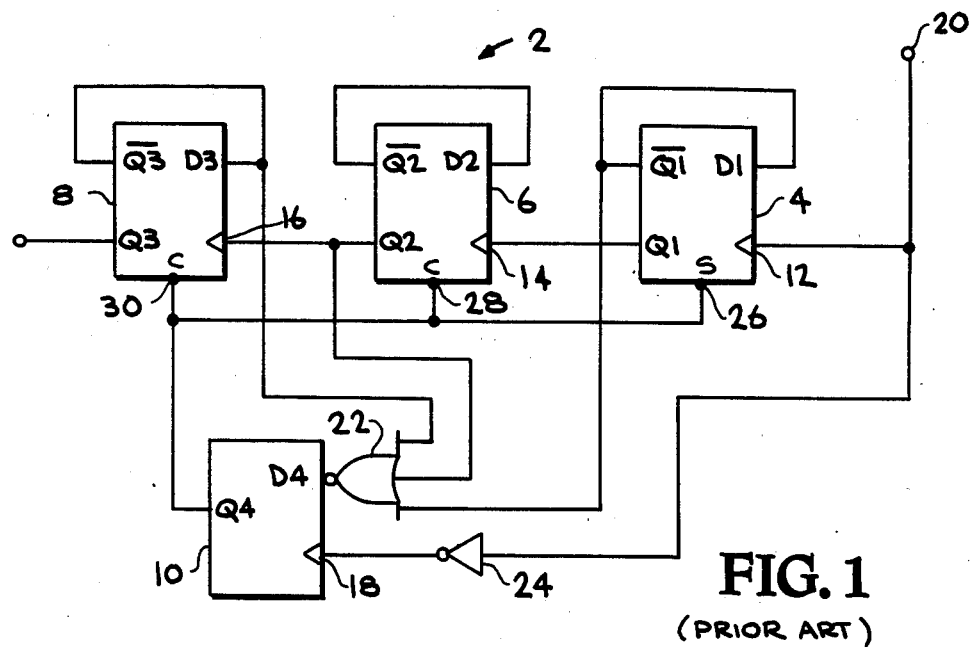
FIG. 1 is a schematic diagram of a frequency divider circuit known in the prior art.

FIG. 1 shows a frequency divide-by-5 circuit 2 of the prior art. The frequency divider circuit 2 includes D-type flip-flops 4, 6, 8, 10. Such flip-flops are well known in the prior art. The flip-flops 4, 6, 8, 10 each have a data input $D_1$ through $D_4$, respectively. The flip-flops 4, 6, 8, 10 also each have noninverting data outputs $Q_1$ through $Q_4$, respectively, and complementary, or inverting data outputs $\overline{Q}_1$ through $\overline{Q}_4$, respectively. Finally, the flip-flops 4, 6, 8, 10 each have clock inputs 12, 14, 16, 18, respectively.

A frequency input 20 of the frequency divider circuit 2 is coupled to the clock input 12 of the flip-flop 4. The data input $D_1$ and the data output $\overline{Q}_1$ are coupled together to a first input of NOR gate 22. The data output $Q_1$ of the flip-flop 4 is coupled to the clock input 14 of the flip-flop 6. The data output $\overline{Q}_2$ of the flip-flop 6 is coupled to the data input $D_2$ of the flip-flop 6. The other data output $Q_2$ of the flip-flop 6 is coupled to a second input of NOR gate 22.

The data output $Q_2$ of the flip-flop 6 is coupled to the clock input 16 of the flip-flop 8. The data output $\overline{Q}_3$ of the flip-flop 8 is coupled together with the data input $D_3$ of the flip-flop 8 to a third input of NOR gate 22. The data output $Q_3$ of the flip-flop 8 is the frequency output for the frequency divider circuit 2.

The output of the NOR gate 22 is coupled to the data input $D_4$ of the flip-flop 10. The frequency input 20 of frequency divider circuit 2 is coupled through an inverter 24 to the clock input 18 of the flip-flop 10. Finally, the data output $Q_4$ of the flip-flop 10 is coupled collectively to a set input 26 of the flip-flop 4, a clear input 28 of the flip-flop 6 and a clear input 30 of the flip-flop 8.

The operation of the frequency divider circuit 2 can be explained as follows: Assuming a starting internal state of $<0,0,0,0>$, i.e., each of the data outputs $Q_1$ to $Q_4$ is zero, ($<Q_4, Q_3, Q_2, Q_1> = <0,0,0,0>$), upon the first rising edge of a clock pulse at the frequency input 20, the flip-flop 4 will change state such that the data output $Q_1$ will be a logic HIGH or one. This is so because the flip-flop 4, like the flip-flops 6 and 8, has its inverting output coupled back to its data input. Thus, each of the flip-flops 4, 6, 8 will change state when a rising clock edge is presented at its respective data input. The logical one output of the flip-flop 4, in turn, clocks the flip-flop 6, causing the flip-flop 6 to change state such that the data output $Q_2$ will be a logical one. Similarly, the logical one output of the flip-flop 6 clocks the flip-flop 8, causing the flip-flop 8 to change state such that the data output $Q_3$ will be a logical one. Thus, after the first rising edge of a clock pulse at the frequency input 20, the internal state of the frequency divider circuit 2 will be $<Q_4, Q_3, Q_2, Q_1> = <0,1,1,1>$.

It will be noted that after the rising edge of the first clock pulse at the frequency input 20, each of the inverting data outputs $\overline{Q}_1, \overline{Q}_2, \overline{Q}_3$ is a logical zero. Next, on the falling edge of the first clock pulse at the frequency input 20, the flip-flop 10 is clocked. This is due to the inverter 24, which changes the logical zero from the falling edge of any clock pulse of the frequency input 20 to a logical one. The flip-flop 10, however, will not change state until a logical one is presented at the data input $D_4$, from the output of the NOR gate 22.

The NOR gate 22 operates to sense the states of the flip-flops 4, 6, 8. When the data outputs $Q_3, Q_2, Q_1$ equal logical one, logical zero, and logical one, respectively, (i.e., $<1,0,1>$) the output of the NOR gate 22 will go "HIGH" (i.e., to a logical one). The next falling edge of a clock pulse on the frequency input 20 will cause the flip-flop 10 to change state such that the data output $Q_4$ will be a logical one. The effect of this transition is discussed below.

On the rising edge of a second clock pulse at the frequency input 20, the flip-flop 4 again changes state such that the data output $Q_1$ becomes a logical zero. The flip-flop 6 and, subsequently, the flip-flop 8, however, will not change state because the logical zero at data output $Q_1$ will not clock the flip-flop 6, which, in turn, will not clock the flip-flop 8. Thus, the internal state of the frequency divider circuit 2 at this time is $<Q_4, Q_3, Q_2, Q_1> = <0,1,1,0>$.

On the rising edge of a third clock pulse at the frequency input 20, the flip-flop 4 once again changes state such that the data output $Q_1$ becomes a logical one. The logical one at data output $Q_1$ in turn clocks the flip-flop 6, causing the flip-flop 6 to change state such that the data output $Q_2$ becomes a logical zero.

At this point, the internal state of the frequency divider circuit 2 is $<Q_4, Q_3, Q_2, Q_1> = <0,1,0,1>$. Note that when $Q_3=1, \overline{Q}_3=0$; and when $Q_1=1, \overline{Q}_1=0$. Since the three inputs to NOR gate 22 are $\overline{Q}_3, \overline{Q}_2$ and $\overline{Q}_1$, at this point in the counting sequence NOR gate 22 is presented with an input of $<000>$, causing the output of the NOR gate 22 to change to a logical one. Thus, a logical one is presented to the data input $D_4$ of the flip-flop 10.

Next, on the falling edge of the third clock pulse at the frequency input 20, the flip-flop 10 is clocked, causing the flip-flop 10 to change state such that the data output $Q_4$ becomes a logical one.

As can be seen in FIG. 1, data output $Q_4$ is coupled to "clear" terminals 28, 30 of the flip-flops 6 and 8, respectively. Data output $Q_4$ is also coupled to a "set" terminal 26 of the flip-flop 4. The set terminal 26 of the flip-flop 4 operates to set the data output $Q_1$ to a logical one when a logical one is presented to the set terminal 26. The clear terminals 28, 30 operate to set the data output $Q_2$ and $Q_3$, respectively, to a logical zero when a logical one is presented to the clear terminals 28, 30.

The set terminal 26 and the clear terminals 28, 30 are coupled to circuitry internal to the flip-flops 4, 6 and 8, respectively, that functions to override the operation of the clock inputs 12, 14, 16 so long as a logical one is present on the set terminal 26 and the clear terminals 28, 30. Thus, data output $Q_1$ remains at logical one and data outputs $Q_2$ and $Q_3$ remain at logical zero until the next falling edge of a fourth clock pulse at frequency input 20, which returns data output $Q_4$ to a logical zero.

Next, on the rising edge of the fifth clock pulse on frequency input 20, the flip-flop 4 is clocked causing the flip-flop 4 to change state such that the data output $Q_1$ becomes a logical zero. The frequency divider circuit 2 is thus once again in its starting internal state; i.e., $<Q_4, Q_3, Q_2, Q_1> = <0,0,0,0>$.

The counting sequence of the prior art frequency divider circuit 2 is shown below in Table 1.

TABLE 1

Counting Sequence of Prior Art
Frequency Divider Circuit 2 (FIG. 1)

| Clock Pulse | Data Outputs | | | |
|---|---|---|---|---|
| | $Q_4$ | $Q_3$ | $Q_2$ | $Q_1$ |
| 1 | 0 | 1 | 1 | 1 |
| 2 | 0 | 1 | 1 | 0 |
| 3 | 0 | 1 | 0 | 1 |
| 4 | 1 | 0 | 0 | 1 |
| 5 | 0 | 0 | 0 | 0 |
| 6 | 0 | 1 | 1 | 1 | (repeat)
↓

Figure 2:
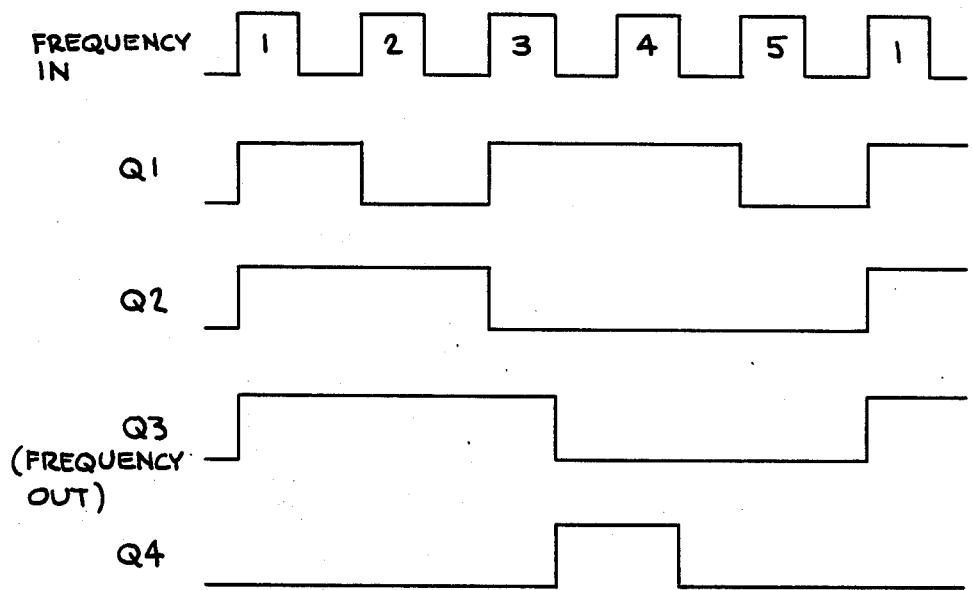
FIG. 2 is a diagram of the timing waveforms for the frequency divider circuit of FIG. 1.

FIG. 2 shows the timing pattern described above for the frequency divider circuit 2. Note that the frequency on the frequency out terminal $Q_3$ is reduced by five times from the frequency on the frequency input terminal 20. Thus, for every five input pulses on frequency input 20, the frequency divider circuit 2 delivers one output pulse at data output $Q_3$ (frequency output terminal).

Using current bipolar technology with minimum current density gates, the frequency divider circuit 2 is only capable of operating up to speeds less than 100 MHz. If the frequency rate at the frequency input 20 should exceed the 100 MHz timing constraint, the circuit will malfunction, escaping from the desired count sequence.

The critical timing, limiting the speed of the frequency divider circuit 2, occurs during the "HIGH" portion of the third clock pulse on the frequency input 20. The following timing events, initiated by the rising edge of the third clock pulse, must be completed prior to the falling edge of the third clock pulse:

1. Propagation delay of a signal from the frequency input 20 to the data output $Q_1$: $\approx$2.5 nanoseconds (ns);
2. Propagation delay of a signal from the data output $Q_1$ to the data output $Q_2$: $\approx$2.5 ns;
3. Propagation delay of a signal from the data outputs $Q_1$ and $Q_2$ to the output of NOR gate 22: $\approx$2 ns; and
4. The set-up time of the output of NOR gate 22 at the data input $D_4$: 1 ns.

TOTAL: 8 ns.

Thus, three propagation delays and a set-up time must occur all within one-half of the frequency-in period.

A further problem with the design of the frequency divider circuit 2 is the probability of disturbance of the count sequence from spurious states. This arises because of the number of bits that switch simultaneously. Referring to Table 1, it can be seen that when the frequency divider circuit 2 changes from clock pulse 1 to clock pulse 2, three bits change simultaneously (0,0,0 to 1,1,1); and when the circuit changes from clock pulse 3 to clock pulse 4, two bits change simultaneously.

Figure 3:
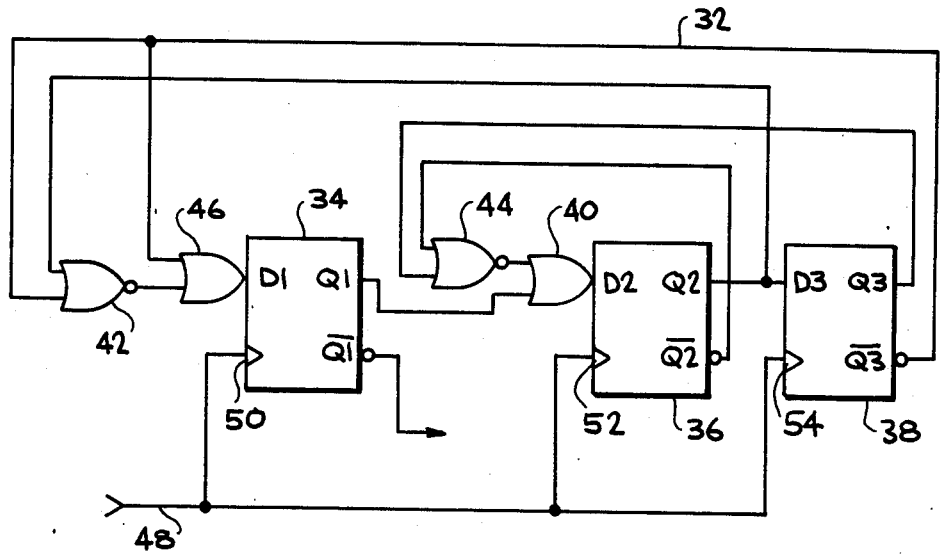
FIG. 3 is a schematic diagram of the frequency divide-by-5 circuit of the present invention.

FIG. 3 shows a schematic diagram of a frequency divider circuit 32 in accordance with the present invention. The frequency divider circuit 32 is comprised of D-type flip-flops 34, 36, 38. The flip-flops 34, 36, and 38 each have a data input, $D_1$ through $D_3$, respectively, and a data output, $Q_1$ through $Q_3$, respectively. Each of the flip-flops 34, 36, 38 also has an inverting data output, $\overline{Q}_1$ through $\overline{Q}_3$, respectively.

The data output $Q_1$ of the flip-flop 34 is coupled to a first input of an OR gate 40. The inverting output $\overline{Q}_1$ of the flip-flop 34 is the frequency output for the frequency divider circuit 32.

The data output $Q_2$ of the flip-flop 36 is coupled to the data input $D_3$ of the flip-flop 38, and is further coupled to a first input of a NOR gate 42. The inverting data output $\overline{Q}_2$ of the flip-flop 36 is coupled to a first input of a NOR gate 44.

The data output $Q_3$ of the flip-flop 38 is coupled to a second input of the NOR gate 44. The output of the NOR gate 44 is coupled to a second input of the OR gate 40. The output of the OR gate 40 is coupled to the data input $D_2$ of the flip-flop 36.

The inverting data output $\overline{Q}_3$ of the flip-flop 30 is coupled to a first input of an OR gate 46, and is further coupled to a second input of the NOR gate 42. The output of the NOR gate 42 is coupled to a second input of the OR gate 46. The output of the OR gate 46 is coupled to the data input $D_1$ of the flip-flop 34. (Note: The OR gate 46 is actually internal to the flip-flop 34, but is shown externally for purposes of illustration.)

Frequency input 48 is coupled to clock inputs 50, 52, 54 of the flip-flops 34, 36 and 38, respectively. The following discussion of the operation of the frequency divider circuit 32 can be followed by referring to the circuit connections described above.

The operation of the frequency divider circuit 32 of the present invention is as follows: Assume a starting internal state of $<Q_1, Q_2, Q_3> = <0,0,0>$. When $<Q_1, Q_2, Q_3> = <0,0,0>$, then each of $\overline{Q}_1$, $\overline{Q}_2$ and $\overline{Q}_3$ will be a logical one. When $Q_1=0$, input of the OR gate 40 will be logical zero. When $Q_2=0$, a first input of the NOR gate 42 will be logical zero. A second input of the NOR gate 42 is a logical one, because $\overline{Q}_3=1$. Thus, the output of the NOR gate 42 will be logical zero at this point. Therefore, one input of the OR gate 46 will also be logical zero. The other input to the OR gate 46 is a logical one because $\overline{Q}_3=1$. Therefore, data input $D_1$ is presented with a logical one from the output of the OR gate 46.

Also during the starting state of $<Q_1, Q_2, Q_3> = <0,0,0>$, one input of the NOR gate 44 will be a logical one because $\overline{Q}_2=1$. The other input of the NOR gate 44 will be a logical zero because $Q_3=0$. Therefore, the output of the NOR gate 44 is a logical zero which is presented at one input of the OR gate 40. The other input of the OR gate 40 is a logical zero because $Q_1=0$. Therefore, the output of the OR gate 40 equals a logical zero, which is presented at the data input $D_2$ of the flip-flop 36.

Referring to FIG. 3, it can be seen that during the starting state of $<Q_1, Q_2, Q_3> = <0,0,0>$, the three data inputs $D_1$, $D_2$, and $D_3$ equal logical one, logical zero and logical zero, respectively.

On the rising edge of a first clock pulse at the frequency input 48, all three flip-flops 34, 36, 38 are clocked simultaneously. As can be seen from the discussion above, only the flip-flop 34 will change state because only the flip-flop 34 has a logical one on its data input. Therefore, after the rising edge of a first clock pulse on the frequency input 48, the internal state of the frequency divider circuit 32 is $<Q_1, Q_2, Q_3> = <1,0,0>$.

After the rising edge of the first clock pulse at the frequency input 48, the following circuit nodes will have changed logical signal levels: $Q_1$ equals a logical one; therefore, one input of the OR gate 40 equals a logical one; and thus the output of the OR gate is a logical one which is presented at the data input $D_2$ of the flip-flop 36. Also, since $Q_1=1$, $\overline{Q}_1=0$.

On the rising edge of a second clock pulse at the frequency input 48, all three flip-flops 34, 36, 38 are again clocked simultaneously. Only the flip-flop 36 will change state, however, because it is the only flip-flop that has an input ("1") different from its output ("0") at the time it is clocked. Thus, after the second clock pulse on the frequency input 48, the data output $Q_2$ equals a logical one, and the internal state of the frequency divider circuit 32 is $<Q_1, Q_2, Q_3> = <1,1,0>$.

After the rising edge of the second clock pulse at the frequency input 48, the following circuit nodes will have changed logical signal levels: Because $Q_2$ now equals logical one, $\overline{Q}_2 = 0$; the data input $D_3 = 1$; and a second input of the NOR gate 42 now equals logical one. Since $\overline{Q}_2 = 0$, a second input of the NOR gate 44 now equals zero. Therefore the output of the NOR gate 44 is a logical one.

On the rising edge of the third clock pulse at the frequency input 48, the three flip-flops 34, 36, 38 are clocked simultaneously; only the flip-flop 38 changes state since its input ("1") is different from its output ("0") immediately prior to the third clock pulse. Thus, after the third clock pulse at the frequency input 48, the data output $Q_3$ equals a logical one, and the internal state of the frequency divider circuit 32 is $<Q_1, Q_2, Q_3> = <1,1,1>$.

After the third clock pulse, the following circuit nodes will have changed logical signal levels: Because $Q_3$ now equals logical one, $\overline{Q}_3 = 0$, and one input of the NOR gate 44 equals logical one. The output of the NOR gate 44 therefore equals logical zero which is presented at one input of the OR gate 40. Because $\overline{Q}_3$ now equals logical zero, the second input of the NOR gate 42 equals logical zero and a second input of the OR gate 46 equals logical zero. With both inputs of the OR gate 46 being logical zero, the output of the OR gate 46 is logical zero, which is presented at the data input $D_1$ of the flip-flop 34.

On the rising edge of the fourth clock pulse at the frequency input 48, the three flip-flops 34, 36 and 38 are again clocked simultaneously; only the flip-flop 34, however, changes its state, since its input ("0") is different from its output ("1") immediately prior to the fourth clock pulse. Thus, after the fourth clock pulse, the data output $Q_1$ equals logical zero, and the internal state of the frequency divider circuit 32 is $<Q_1, Q_2, Q_3> = <0,1,1>$.

After the fourth clock pulse, the following circuit nodes will have changed logical signal levels: Because $Q_1$ now equals logical zero, $\overline{Q}_1 = 1$; and a second input to the OR gate 40 equals logical zero. Since both inputs to the OR gate 40 are logical zero, the output of the OR gate 40 is logical zero, which is presented at the data input $D_2$ of the flip-flop 36.

On the rising edge of the fifth clock pulse at the frequency input 48, the three flip-flops 34, 36, 38 are simultaneously clocked. On the fifth clock pulse only the flip-flop 36 changes state, since its input ("0") is different from its output ("1") immediately prior to the fifth clock pulse. Thus, after the fifth clock pulse, the data output $Q_2$ is a logical zero, and the internal state of the frequency divider ciruit 32 is $<Q_1, Q_2, Q_3> = <0,0,1>$.

After the fifth clock pulse, the following circuit nodes will have changed logical signal levels: since $Q_2 = 0$, $\overline{Q}_2$ becomes a logical one; the data input $D_3$ of the flip-flop 38 becomes a logical zero; and the second input of the NOR gate 42 becomes a logical zero. The output of the NOR gate 42 now becomes a logical one which is presented to one input of the OR gate 46. The output of the OR gate 46 thus becomes a logical one which is presented to the data input $D_1$ of the flip-flop 34. Finally, since $\overline{Q}_2 = 1$, a second input of the NOR gate 44 becomes a logical one.

On the rising edge of the sixth clock pulse at the frequency input 48 (the beginning of a second timing cycle), the three flip-flops 34, 36, 38 are once again clocked simultaneously. On this clock pulse, two of the flip-flops, 34 and 38, change state. The data output $Q_1$ of the flip-flop 34 becomes a logical one and the data output $Q_3$ of the flip-flop 38 becomes a logical zero. Thus, the frequency divider circuit 32 is now back to the internal state following the first clock pulse in the count sequence; i.e., $<Q_1, Q_2, Q_3> = <1,0,0>$.

The counting sequence of the frequency divider circuit 32 is shown below in Table 2.

TABLE 2

Counting Sequence of the Frequency Divider Circuit 32 (FIG. 3)

| Clock Pulse | Data Outputs | | |
|---|---|---|---|
| | $Q_1$ | $Q_2$ | $Q_3$ |
| 1 | 1 | 0 | 0 |
| 2 | 1 | 1 | 0 |
| 3 | 1 | 1 | 1 |
| 4 | 0 | 1 | 1 |
| 5 | 0 | 0 | 1 |
| 6 | 1 | 0 | 0 (repeat) |

Figure 4:
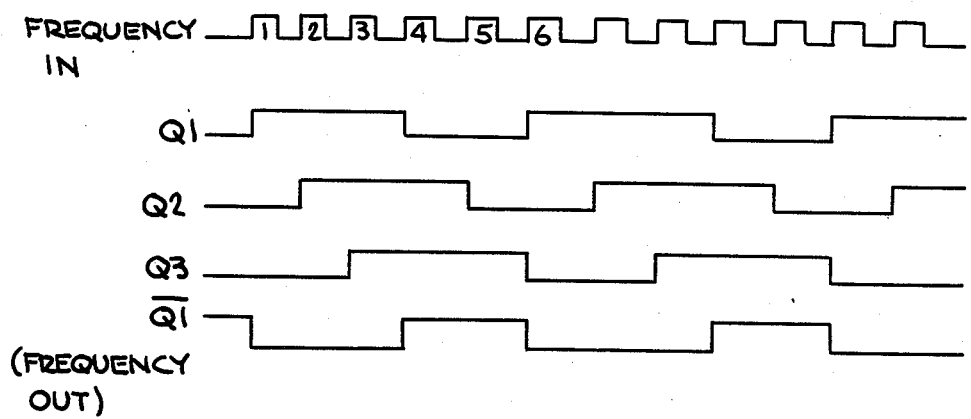
FIG. 4 is a diagram of the timing waveforms for the frequency-divide-by-5 circuit of the present invention.

FIG. 4 shows the timing pattern described above for the frequency divider circuit 32. Note that the frequency on the frequency out terminal $\overline{Q}_1$ is reduced by five times from the frequency on the frequency input terminal 48; i.e., for every five input pulses on the frequency input 48, the frequency divider circuit 32 delivers one output pulse at the data output $\overline{Q}_1$.

The minimum propagation delay in the design of the frequency divider circuit 32 was achieved by sagacious state assignment. Except for the transition from the final state to the initial state in the counting sequence, each successive count in the sequence differs by only a single bit. This eliminates spurious state changes and avoids excessive delay.

The maximum operating frequency of the frequency divider circuit 32 is limited by the transition from the final state to the initial state in the counting sequence. The maximum frequency is given by the following equation:

$$f = \frac{1}{t_{s(34)} + t_{pd(36)} + t_{pd(42)}},$$

where
$t_s(34)$ = set-up time of the flip-flop 34,
$t_{pd}(36)$ = propagation delay of the flip-flop 36, and
$t_{pd}(42)$ = propagation delay of the NOR gate 42.
(Note, that since the OR gate 46 is internal to the flip-flop 34, it only appears as a set-up to the flip-flop 34 and not as a gate delay in the signal path.)

Computer simulations of circuit operation predict the following performance under worst-case conditions at 155° centigrade:

| | | |
|---|---|---|
| $t_s(34)$ | = | 1.2 ns |
| $t_{pd}(36)$ | = | 3.5 ns |
| $t_{pd}(42)$ | = | 1.6 ns |
| Total | = | 6.3 ns |

-continued

Maximum input frequency = 158.7 MHz

While the above represents worst-case conditions, with current bipolar technologies, the frequency divider circuit 32 is capable of operating at speeds up to 250 MHz.

It will be noted that in any 3-flip-flop binary counter circuit (i.e., 3 output bits), there are eight possible count states. It will also be noted that the counting sequence of the frequency divider circuit 32 utilizes only five of the possible eight states. In such a situation, there is a possibility that the frequency divider circuit 32 could, by chance, find itself in any one of the three unused states. This could occur when the circuit is powered-up or could result from external noise affecting the state of a flip-flop.

For every state in the counting sequence shown in Table 2, the state to which the circuit goes at the next input clock pulse is known; but the next state for an unused state is not known. Thus, there is the further possibility that when a flip-flop is "thrown" into an unused state, the counter might oscillate from unused state to unused state, never arriving at a used state. A circuit whose unused states have this feature is said to suffer from "lockout."

If, by chance, the frequency divider circuit 32 should enter any unused state ($Q_1, Q_2, Q_3 = 0,0,0; 0,1,0; 1,0,1$), it will quickly return to the correct counting sequence, thus preventing lockout. This is accomplished by NOR gate 42 and NOR gate 44. For example, if the frequency divider circuit 32 was powered-up to state $<Q_1, Q_2, Q_3> = <1,0,1>$, the NOR gate 44 would hold $Q_1$ equal to a logical one until the count entered state $<Q_1, Q_2, Q_3> = <1,1,0>$. If, instead, the frequency divider circuit 32 was powered up to state $<Q_1, Q_2, Q_3> = <0,1,0>$, $Q_2$ would be held equal to a logical one until the count entered the state $<Q_1, Q_2, Q_3> = <1,1,1>$. Without the NOR gate 44, the frequency divider circuit 32 would oscillate between states $<Q_1, Q_2, Q_3> = <0,1,0<$ and $<1,0,1>$.

Likewise, if state $<Q_1, Q_2, Q_3> = <0,0,0>$ should occur, the first input of the OR gate 46 (which is coupled to the data output $\overline{Q}_3$) ensures that the next state will be $<Q_1, Q_2, Q_3> = <1,0,0>$, thus returning to the correct count sequence.

The foregoing description of a specific embodiment of the present invention has been presented for purposes of illustration and description. It is not intended to be exhaustive or to limit the invention to the precise form disclosed, and obviously many modifications and variations are possible in light of the above teaching. The embodiment was chosen and described in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto and their equivalents.

What is claimed is:

1. A high-speed frequency divide-by-5 circuit comprising:
    a first flip-flop means having a data input, a clock input, and at least one output;
    a second flip-flop means having a clock input, a data input, and at least one output, said data input being coupled to said at least one output of said first flip-flop means;
    a third flip-flop means having a data input coupled to said at least one output of said second flip-flop means, a clock input and at least one output said at least one output of said third flip-flop means being coupled to the data input of said second flip-flop means;
    a first OR gate coupled between said at least one output of said first flip-flop means and said data input of said second flip-flop means;
    a first NOR gate coupled to a first input of said first OR gate, said first NOR gate also having a first input coupled to a second output of said second flip-flop means, and a second input coupled to said at least one output of said third flip-flop means, said first OR gate also having a second input coupled to said at least one output of said first-flop means; and
    a means for simultaneously providing clock pulses to each of said clock inputs of said first, second and third flip-flop means; and
    such that when a first clock pulse is simultaneously transmitted to each of said clock inputs, logic signals at the at least one output of said first, second and third flip-flop means are, respectively, a logical one, a logical zero and a logical zero,
    and when a second clock pulse is simultaneously transmitted to each of said clock inputs, the at least one output of said second flip-flop means changes state to a logical one,
    and when a third clock pulse is simultaneously transmitted to each of said clock inputs, the at least one output of said third flip-flop means changes state to a logical one,
    and when a fourth clock pulse is simultaneously transmitted to each of said clock inputs, the at least one output of said first flip-flop means changes state to a logical zero,
    and when a fifth pulse is simultaneously transmitted to each of said clock inputs, the at least one output of said second flip-flop means changes state to a logical zero; and
    when a sixth clock pulse is simultaneously transmitted to said clock inputs, the at least one outputs of said first and third flip-flop means change state to a logical one and a logical zero, respectively, returning the circuit to the original output state of the first clock pulse.

2. The circuit of claim 1 further including:
    a second OR gate having an output coupled to the data input of said first flip-flop means and having a first input coupled to a second output of said third flip-flop means; and
    a second NOR gate having an output coupled to a second input of said second OR gate and having a first input coupled to said at least one output of said second flip-flop means and having a second input coupled to said second output of said third flip-flop means.

3. A high-speed frequency divide-by-5 counter circuit comprising:
    a first flip-flop means having a data input, a clock input, a noninverting output and an inverting output, said inverting output being the output of said divide-by-5 circuit;
    a second flip-flop means having a data input, a clock input, a noninverting output and an inverting output, said noninverting output of said first flip-flop means being coupled through a first OR gate to the data input of said second flip-flop means, said first OR gate having an output coupled to said data input of said second flip-flop means, and a first input coupled to said noninverting output of said first flip-flop means, and said inverting output of said second flip-flop means being coupled through a second input of said first OR gate to said data input of said second flip-flop means; and a third flip-flop means having a data input, a clock input, a noninverting output and an inverting output, said noninverting output being coupled through the second input of said first OR gate to said data input of said second flip-flop means, said inverting output of said third flip-flop means being coupled through a first input of a second OR gate to the data input of said first flip-flop means, said inverting output of said third flip-flop means being further coupled to a first input of a first NOR gate, said first NOR gate having an output coupled to a second input of said second OR gate, said second OR gate having an output coupled to the data input of said first flip-flop means, wherein said noninverting output of said second flip-flop means is coupled to the data input of said third flip-flop means, and is further coupled to a second input of said first NOR gate, and further, wherein each of said clock inputs of said first, second and third flip-flop means is coupled to an external means for providing clock pulses.

4. A frequency divide by-5 circuit according to claim 3 wherein said circuit counts according to the following counting sequence:

| Clock Pulse from External Means for Providing Clock Pulses | 1st Flip-Flop Means Noninverting Output | 2nd Flip-Flop Means Noninverting Output | 3rd Flip-Flop Means Noninverting Output |
| --- | --- | --- | --- |
| 1st Clock Pulse | 1 | 0 | 0 |
| 2nd Clock Pulse | 1 | 1 | 0 |
| 3rd Clock Pulse | 1 | 1 | 1 |
| 4th Clock Pulse | 0 | 1 | 1 |
| 5th Clock Pulse | 0 | 0 | 1 |

5. A frequency divide-by-5 circuit according to claim 1 further including a second NOR gate having its output coupled to the second input of said first OR gate, said second NOR gate also having a first input coupled to the inverting output of said second flip-flop means and a second input coupled to the noninverting output of said third flip-flop means, said second NOR gate functioning to prevent said circuit from oscillating between the unused logical states 000, 010 and 101.

6. A frequency divide-by-5 circuit according to claim 3 wherein said first, second and third flip-flop means each comprise a D-type flip-flop.

* * * * *